United States Patent

Deyrup

[11] 3,963,590
[45] June 15, 1976

[54] PROCESS FOR ELECTROPLATING POLYOXYMETHYLENE

[75] Inventor: Edward Johnson Deyrup, Northeast, Md.

[73] Assignee: E. I. Du Pont de Nemours and Company, Wilmington, Del.

[22] Filed: Feb. 25, 1975

[21] Appl. No.: 552,999

[52] U.S. Cl. .................................. 204/30; 29/195; 204/32 R; 204/38 B; 204/38 E; 427/304; 427/306; 427/307; 427/322
[51] Int. Cl.² .......................................... C25D 5/56
[58] Field of Search ............... 204/30, 38 E, 32 R, 204/38 B; 29/195 P; 427/322, 304, 306, 307

[56] References Cited
UNITED STATES PATENTS

| | | | |
|---|---|---|---|
| 3,533,828 | 10/1970 | Rowe | 204/30 X |
| 3,554,880 | 1/1971 | Jenkin | 204/30 |

*Primary Examiner*—G. L. Kaplan

[57] ABSTRACT

An improved process for electroplating polyoxymethylene is provided wherein a shaped article of polyoxymethylene is treated with quinoline or γ-butyrolactone preferably by immersion techniques prior to subjecting the shaped article to surface treatment with an acid etching agent.

2 Claims, No Drawings

PROCESS FOR ELECTROPLATING POLYOXYMETHYLENE

FIELD OF THE INVENTION

The present invention relates to a process for electroplating shaped structures of polyacetal polymeric material and, more particularly, is directed to a novel improved process for electroplating articles of polyoxymethylene.

BACKGROUND OF THE INVENTION

Processes and methods for electroplating shaped structures or objects of polyacetal resins such as polyoxymethylene are known. For example, U.S. Pat. No. 3,554,880 discloses a process for electroplating an article of polyoxymethylene which comprises first subjecting the article to a surface preparation treatment by immersing the article in an acid agent such as orthophosphoric acid thereby to etch the surface of the article. The acid-etched article is thereafter treated as by an immersion technique with a basic solution such as sodium hydroxide. The thus treated article is then subjected to the conventional electroplating technique which entails the sequential steps of treating the article with sensitizing agents and activating agents followed by depositing an electroless plating of, for example, copper, on the article and thereafter electroplating the article in a conventional electroplating bath. A drawback and continuing problem encountered heretofore as regards the electroplating of polyoxymethylene articles has been the inability to obtain plated articles wherein the metal plating is firmly bonded to the surface of the plastic article. Oftentimes, the metal coating on the plastic object will exhibit undesirable blistering when the plated plastic object is subjected to a thermal cycle of heating and cooling, and the plastic objects often exhibit undesirable surface cracks which are believed to be induced by the acid etchant. The principal object of the present invention is to provide an improved process for electroplating shaped articles and objects of polyacetal resins such as polyoxymethylene that are characterized by firmly adhered metal coatings that are substantially free of the above-mentioned drawbacks.

THE INVENTION

According to the present invention there is provided in a process for electroplating a shaped article of polyoxymethylene by the sequential steps of etching the surface of said article with an acid etching agent such as orthophosphoric acid, neutralizing the etched surface of said article with a basic solution such as sodium hydroxide, treating said article with a noble metal catalyst such as palladium, depositing by electroless plating a metal coating such as nickel on said article, and depositing by electroplating a metal coating such as nickel, copper or chrome on said electroless plated article, the improvement which comprises treating said article with quinoline or γ-butyrolactone before etching the surface of said article.

DETAILED DESCRIPTION

The nature and advantages of the present invention will be more clearly understood by the following more detailed description thereof.

The salient feature of the present invention is the discovery that subjecting polyoxymethylene shaped articles to a treatment with quinoline or γ-butyrolactone prior to the conventional pre-treatment with acid etchants and catalysts (for electroless deposition) prior to the electroless plating and the electroplating thereof results in superior plated polyoxymethylene shaped articles characterized by a unique surface topography after etching and a more uniformly etched surface, fewer acid-etchant induced surface cracks, and unexpected and surprising adhesion of the metal coating which contributes superior resistance to blistering during use.

The improved process of the present invention may be practiced by treating the shaped articles of polyoxymethylene with quinoline or γ-butyrolactone. This is preferably done by immersing the polyoxymethylene article in the quinoline or γ-butyrolactone. The quinoline or γ-butyrolactone utilized for the treatment may be a solution entirely of quinoline or γ-butyrolactone or an aqueous solution thereof containing up to about 75% by volume of water.

After the treatment with quinoline or γ-butyrolactone, the polyoxymethylene article is subjected to a preplate process and an electroplating process similar to that described in the aforementioned U.S. Pat. No. 3,554,880.

The principle and practice of the present invention will now be illustrated by the following Examples which are exemplary only and it is not intended that the invention be limited thereto since modifications in technique and operation will be apparent to anyone skilled in the art. All parts and percentages specified in the Examples are by volume unless otherwise specified.

EXAMPLE 1

Polyoxymethylene homopolymer (number average molecular weight of 39,000) containing 0.25% by weight of nylon stabilizer and 0.125% by weight antioxidant (CA0-5,-2,2'-methylene-bis(4-methyl-6-t-butyl) phenol were molded by conventional molding techniques (at a mold temperature of 210°F) into plaques having a planar dimension of 3 inches by 5 inches and a thickness of ⅛-inch.

The plaque samples were immersed for 2 minutes into an alkaline cleaner solution comprising 6 oz. of Metex TS-40A (MacDermid, Inc., Waterbury, Connecticut) per gallon of distilled water maintained at 80°C and thereafter rinsed for 2 minutes with water at room temperature.

The cleaned plaque samples were next immersed for 5 minutes in a solution of 30% quinoline and 70% distilled water maintained at 60°C, followed by a 1 minute rinse with water at room temperature.

The quinoline-treated plaque samples were next immersed for 3 minutes in a solution of distilled water containing 83% by volume of 85% by weight orthophosphoric acid maintained at 70°C, followed by a 1 minute rinse with water at room temperature.

The acid etched plaque samples were next immersed for 6 minutes in a distilled water solution containing 12% by weight sodium hydroxide maintained at 95°C.

The base-neutralized plaque samples were next immersed for 10 minutes in a distilled water solution containing 1% by volume of acetic acid maintained at 60°C.

The surface treated polyoxymethylene plaque samples were next subjected to electroless nickel plating in the following manner: (1) the plaques were first immersed for 2 minutes in a preactivator bath (maintained at room temperature) consisting of a solution of distilled water containing 1% by volume of MACuplex Preactivator PA-3 (MacDermid, Inc., Waterbury, Connecticut), followed by one minute rinse with water at room temperature, (2) the plaques were next immersed for two minutes in a palladium activator bath (maintained at room temperature) consisting of a solution of distilled water containing 10% by volume of MACuplex Activator D-34 (MacDermid, Inc., Waterbury, Connecticut) and 20% by volume of HCl, followed by one minute rinse with water at room temperature, (3) the plaques were next immersed for 1 minute in an accelerator bath (maintained at 50°C) consisting of an aqueous solution of distilled water containing 5% by volume of MACuplex D-45 Accelerator (MacDermid, Inc., Waterbury, Connecticut), followed by a 1 minute rinse with water at room temperature, (4) the plaques were next electroless plated by immersing the plaques for 10 minutes into a commercially available electroless nickel bath (maintained at 30°C) consisting of a solution of distilled water containing about 10% by volume of MACuplex J-60 Electroless Ni concentrate (MacDermid, Inc., Waterbury, Connecticut) and about 3% by volume of MACuplex Electroless Ni Reducer J-61 (McDermid, Inc., Waterbury, Connecticut) having a pH of about 9.0 maintained by the appropriate addition of concentrated (28%) ammonium hydroxide.

The electroless nickel plated plaque samples were next electroplated by subjecting the plaques to the sequential steps of the electroplate sequence set forth in the following table; the plaques were immersed sequentially into each treating bath of the composition identified in the table by immersing the plaques under the condition also set forth in the table;

For comparative purposes, the foregoing procedure was repeated except that the polyoxymethylene plaque samples were not subjected to either the quinoline of the γ-butyrolactone treatment. The results are reported in Table 1 below.

The copper plated plaques were tested for adhesion by evaluating the peel strength of the metallic coating thereon. The results are reported in Table 1 below.

The peel strength of the metallic coating on the plaque specimen is measured by cutting the metal plated plaque to provide a specimen having a width of 1 inch and a length of 4 inches. The metallic coating at one end of the plaque specimen is then cut with a knife at the interface with the plastic surface of the specimen, and the metallic coating is peeled from the plastic surface for a distance of about ½ inch. The plaque specimen is next secured to a flat surface and the peeled end of the metallic coating is secured by the clamping jaws of a Diventco Pull Tester (Model No. 32-69-R-001). The metallic coating is then peeled from the plaque specimen for a distance of about 3 inches by pulling the Diventco Pull Tester at a rate of 1 inch per minute. The peel strength registered on the dial of the Diventco Pull Tester is recorded at every ½ inch of metallic coating peeled from the plaque specimen. The peel strength value listed in Table 1 is the average value of the six recordings obtained for each plaque specimen.

TABLE 1

| Example | Resin | Quinoline Treatment | Butyrolactone Treatment | Peel Strength (lbs) |
|---|---|---|---|---|
| 1 | homopolymer | yes | no | 11.1 |
| 2 | homopolymer | no | yes | 9.6 |
| Comparative | homopolymer | no | no | 7.4 |

| Step | Bath Composition | Electroplate Sequence Temperature °F | Current Density, Amps/Sq. Ft. | Time (Min.) | Plate Thickness |
|---|---|---|---|---|---|
| 1 | 5% H₂SO₄ | 70 | — | until gas begins to evolve | — |
| 2 | Water Rinse | 70 | — | 0.25 | — |
| 3* | Ni Strike (Watts Ni) | 135–140 | 15 | 2 | — |
|  |  |  | 20 | 1 |  |
|  |  |  | 30 | 1 |  |
|  |  |  | 40 | 1 | 0.1 mil |
| 4 | Water Rinse | 70 | — | 0.2 | — |
| 5 | 5% H₂SO₄ | 70 | — | 0.2 | — |
| 6 | Water Rinse | 70 | — | 0.2 | — |
| 7 | MacDermid Bright Acid Copper | 70 | 40 | 60 | 2 mil |

*The nickel-strike was deposited by immersing the plaque samples into the Watts type nickel plating bath operating at a current density of about 15 amps/sq. ft. for up to about 2 minutes after which the current density of the bath was raised as indicated.

EXAMPLE 2

The procedure of Example 1 was repeated except that the polyoxymethylene plaques were immersed for 5 minutes in a solution of 50% γ-butyrolactone and 50% distilled water maintained at 60°C instead of the quinoline solution. The results are shown in Table 1 below.

What is claimed is:

1. In a process for electroplating a shaped article of polyoxymethylene by the sequential steps of etching the surface of said article with an acid etchant, neutralizing the etched surface of said article with a base solution, treating said article with a catalyst for electroless deposition, depositing by electroless plating a metal coating on said article, and depositing by electroplating a metal coating on said article, the improvement which comprises contacting said article with a liquid comprising quinoline or γ-butyrolactone before etching the surface of said article.

2. The process of claim 1 wherein said liquid comprises quinoline or γ-butyrolactone and up to about 75% by volume of water.

* * * * *